(12) United States Patent
Wang et al.

(10) Patent No.: US 9,054,681 B2
(45) Date of Patent: Jun. 9, 2015

(54) HIGH SPEED DUTY CYCLE CORRECTION AND DOUBLE TO SINGLE ENDED CONVERSION CIRCUIT FOR PLL

(75) Inventors: Youhua Wang, Nan'an District (CN); Junan Zhang, Nan'an District (CN); Dongbing Fu, Nan'an District (CN); Gangyi Hu, Nan'an District (CN); Jun Liu, Nan'an District (CN); Ruzhang Li, Nan'an District (CN); Guangbing Chen, Nan'an District (CN)

(73) Assignee: China Electronic Technology Corporation, 24th Research Institute, Nan'an District, Chongqing (CN)

( * ) Notice: Subject to any disclaimer, the term of this patent is extended or adjusted under 35 U.S.C. 154(b) by 183 days.

(21) Appl. No.: 13/522,745

(22) PCT Filed: Aug. 23, 2011

(86) PCT No.: PCT/CN2011/078759
§ 371 (c)(1),
(2), (4) Date: Jul. 18, 2012

(87) PCT Pub. No.: WO2013/023385
PCT Pub. Date: Feb. 21, 2013

(65) Prior Publication Data
US 2013/0257499 A1 Oct. 3, 2013

(30) Foreign Application Priority Data
Aug. 15, 2011 (CN) .......................... 2011 1 0232848

(51) Int. Cl.
*H03K 3/017* (2006.01)
*H03K 5/04* (2006.01)
*H03K 7/08* (2006.01)
*H03K 5/06* (2006.01)
*H03K 5/156* (2006.01)

(52) U.S. Cl.
CPC ................ *H03K 5/06* (2013.01); *H03K 5/1565* (2013.01)

(58) Field of Classification Search
CPC ......... H03K 5/04; H03K 5/06; H03K 5/1565; H03K 3/017; H03K 7/08
USPC ......................................... 327/172, 175, 176
See application file for complete search history.

(56) References Cited

U.S. PATENT DOCUMENTS

| 5,422,585 | A * | 6/1995 | Fan Chiangi et al. ......... 327/170 |
| 6,320,437 | B1 * | 11/2001 | Ma ................................ 327/175 |
| 6,630,851 | B2 * | 10/2003 | Masleid ........................ 327/165 |
| 6,859,081 | B2 * | 2/2005 | Hong et al. ................... 327/175 |

(Continued)

FOREIGN PATENT DOCUMENTS

KR 20050006987 A 1/2005

OTHER PUBLICATIONS

International Search Report for corresponding International Patent Application No. PCT/CN2011/078759 mailed Sep. 29, 2011.

*Primary Examiner* — Hai L Nguyen
(74) *Attorney, Agent, or Firm* — Merchant & Gould P.C.

(57) ABSTRACT

The present invention pertains to a high speed duty cycle correction and double to single ended conversion circuit for PLL, comprising a reshaper stage, a single-edge detection circuit and a duty cycle restorer. The present invention introduces a way to convert double-ended output of PLL VCO into single-ended signal and adjust duty cycle of PLL VCO's output waveform by 50%, so that the circuit can output single ended clock signal with 50% duty cycle.

7 Claims, 4 Drawing Sheets

(56) References Cited

U.S. PATENT DOCUMENTS 7,126,396 B1   10/2006  Courcy
7,180,346 B2 *  2/2007  Lee .............................. 327/175
7,375,563 B1 *  5/2008  Cheung et al. ................ 327/156
7,839,193 B2 * 11/2010  Yeo et al. ..................... 327/175

* cited by examiner

HIGH SPEED DUTY CYCLE CORRECTION AND DOUBLE TO SINGLE ENDED CONVERSION CIRCUIT FOR PLL

This application is a National Stage Application of PCT/CN2011/078759, filed 23 Aug. 2011, which claims benefit of Serial No. 201110232848.3, filed 15 Aug. 2011 in China and which applications are incorporated herein by reference. To the extent appropriate, a claim of priority is made to each of the above disclosed applications.

TECHNICAL FIELD

The present invention relates to semiconductor device and PLL circuit, or more specifically, a duty cycle correction and double- to single-ended conversion circuit. The invention applies to correcting duty cycle of output waveform for PLL VCO and converts output waveform from double-ended signal to single-ended signal.

BACKGROUND

The modern high speed LSI circuit is more and more sensitive to clock signal. Apart from clock jitter, clock duty cycle has a crucial effect on the performance of high speed LSI circuits. So, clock signal with 50% duty cycle is very important in designing high speed LSI circuits, For instance, in high speed analog-to-digital converter and dual data rate SDRAM, as rising-edge and falling-edge of clock was used, clock signal with 50% duty cycle is critical to the system. For high speed dynamic circuit, duty cycle, which determines precharging and evaluation time, has huge impact on its performance. Usually, the duty cycle of PLL VCO's clock signal would deviate from 50% due to device mismatch. To obtain 50% duty cycle clock signal, the conventional method is to perform a ÷2 frequency division of output signal of PLL VCO by frequency divider, which, however, would require that the VCO have oscillating frequency to be doubled clock frequency, making the design of PLL more difficult.

At present, duty cycle correction circuit is usually adopted to fulfill this function. The PLL VCO usually output double ended signals, so double to single ended conversion circuit is employed for application of single ended clock.

SUMMARY OF THE INVENTION

The object of the present invention is to realize a high speed duty cycle correction and double to single ended conversion circuit for PLL, which is deliberately designed to deliver clock signals with 50% duty cycle even if they are far off 50%, while converting input double ended signal into single ended signal.

The high speed duty cycle correction and double to single ended conversion circuit for PLL include:

The clock input reshaper stage, comprising two clock input reshaping circuits I and II, respectively, which receives clock signals 180° out of phase, and outputs a powerful driving clock signal;

The single-edge detection circuit, comprising two single-edge detection circuit I and II, respectively, which receives signals from clock input reshaping circuits I and II, and detects rising and falling edge of clock signal, and then outputs pulse signals when rising or falling edge was detected;

The duty cycle restorer, which receives pulse signals 180° out of phase from two single-edge detection circuits I and II, and then outputs clock signals with the same frequency as pulse signals and 50% duty cycle.

Then the single-edge detection circuits I and II adopt rising-edge detection structure, which outputs a low pulse signal when rising-edge of input clock signal is detected;

Then rising-edge detector circuit adopted by single-edge detection circuits I and II comprises A delay unit to receive clock signal and generate a delay signal, An inverter to receive a delayed clock signal and generate a clock signal in reverse phase, And an NAND gate to receive a clock signal and the delayed clock signal in reverse phase, and to generate a pulse signal.

For single-edge detection circuits I and/or II, another structure of rising edge detector can also be used, which comprises A D-type flip-flop triggered by rising-edge, which receives clock signal at clock input, and connects logic high level VDD with digital input;

Inverter I, whose input is connected to normal phase output of D-type flip-flop, and output is connected to asynchronized reset of D-type flip-flop;

Inverter II, which is connected to normal phase output of D-type flip-flop, and outputs pulse signal;

Then, single-edge detection circuits I and II can adopt a falling-edge detector, which outputs low pulse signal when falling-edge signal is detected;

The falling-edge detector adopted by single-edge detection circuits I and/or II comprises;

A delay unit to receive clock signal and generate delay signal,

An inverter to receive delayed clock signal and generate delayed signal in reverse phase, And an OR gate to receive clock signal and delayed signal in reverse phase, and generate pulse signal;

For single-edge detection circuits I and/or II, another structure of falling edge detector can also be used, which comprises A D-type flip-flop triggered by falling-edge, which receives clock signal at clock input, and connects its digital input with logic high level VDD;

Inverter I, whose input is connected to positive phase output of D-type flip-flop, and output connected with asynchronized reset of D-type flip-flop;

Inverter II, which is connected with positive phase output of D-type flip-flop, and outputs pulse signal.

Then the duty cycle restorer comprises

Inverters I and II, which receive pulse signals with large duty cycle from single-edge detection circuits I and II, respectively;

Inverters III and IV, which receive the reversed pulse signals with large duty cycle from Inverters I and II;

Transmission gate I and II, which receive the reversed pulse signals from Inverters I and II, respectively, and generate delayed pulse signals;

Transmission gate III and IV, which generate high/low level under the control of pulse signals from Transmission gates I and II and reversed pulse signals from Inverters III and IV;

Inverters V and VI connected in series, wherein the input of Inverter V is connected to the output of Transmission gates III and IV, and Inverter VI outputs clock signal.

The other kind of duty cycle restorer comprises

Two inverters to receive large duty cycle pulse signals,

OR gate to receive output signal from inverters,

And an edge trigger to receive output signal from OR gate and generate high/low level.

The above-mentioned "large duty cycle pulse signals" refers to pulse signal with duty cycle larger than 50%.

The duty cycle correction and double to single ended circuit comprises a reshaper stage, a single-edge detection stage and a duty cycle restorer. Compared with the conventional circuit, the present invention has the following advantages:

1. it can output clock signal with 50% duty cycle when the duty cycle of input clock signal is far off 50%;
2. it can convert input double ended signal into single ended signal while adjusting the duty cycle of input signals, which reduces conversion steps and cuts down the cost, compared with the conventional technique;
3. Circuit implementation is simple, compared to the conventional structure, since it uses standard digital cell library and so reduces both cost and circuit complexity;
4. The circuit structure is simple, compared with conventional structure with the same output frequency, it reduces operating frequency of VCO, as well as design difficulty The invention, together with objects and advantages thereof, will be related in the succeeding embodiments and may best be understood by referring to the following description of the presently preferred embodiments together with the accompanying drawings.

DESCRIPTION OF THE DRAWINGS

To better specify objects and advantages, the present invention is related with the accompanying drawings, wherein.

SPECIFIC MODE FOR CARRYING OUT THE INVENTION

Figure 1:
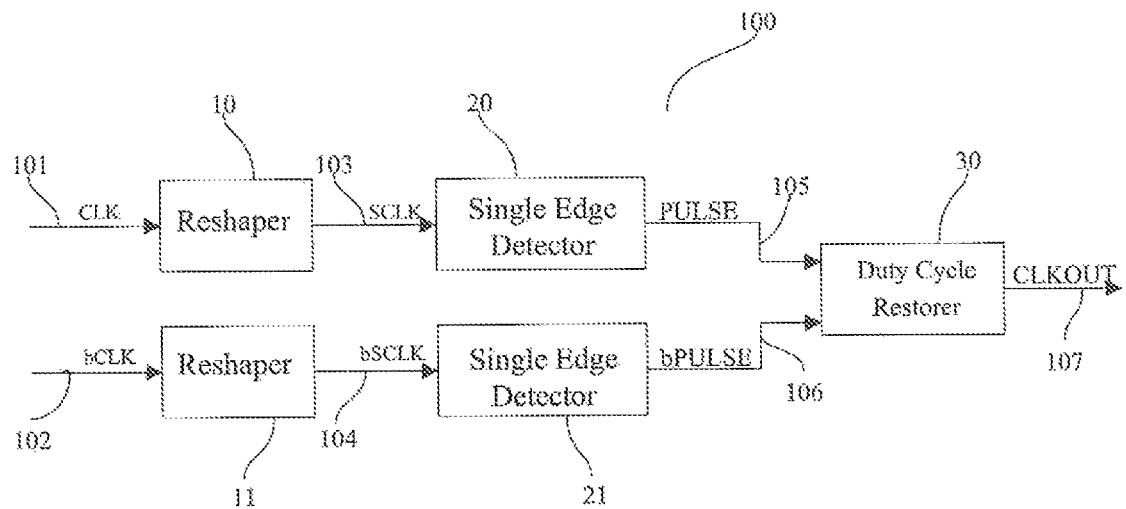
FIG. 1 is a block diagram of the present invention comprising two reshaper stages 10 and 11, two single-edge detection circuit 20 and 21, and a duty cycle restorer 30.

Hereinafter, the preferred embodiments of the present invention will be described using the drawings. It should be understood that the following embodiments are provided just for describing the invention, instead of limiting the property protection scope of the invention As shown in FIG. 1, the input of the circuit is multiphase clock signal CLK 101 and bCLK 102 with a phase difference of 180°, and it outputs single-ended clock signal CLKOUT 107 with 50% duty cycle. The circuit consists of three parts. The first part comprises an input clock reshaper stage containing input clock reshaping circuits I 10 and II 11, which receive multiphase clock signals CLK 101 and bCLK 102 from PLL VCO, and reshape them to enhance their driving power. The second part comprises single-edge detection circuits I 20 and II 21. The single-edge detecting circuit I 20 outputs pulse signal PULSE 105 when an edge (either rising or falling) of clock signal SCLK 103 is detected, and the single-edge detecting circuit II 21 outputs a pulse signal bPULSE 106 when an edge (either rising or falling) of clock signal bSCLK 104 is detected. Note that the single-edge detecting circuits I 20 and II 21 must have a synchronized detecting edge, namely, either rising-edge detection or falling-edge detection. Anyhow, they may have different detecting circuit structures.

The third part is a duty cycle restorer 30, which generates single-end clock signal CLKOUT 107 with 50% duty cycle.

The multiphase clock signal CLK 101 and bCLK 102 output from PLL VCO feature a long rising/falling time. Input clock reshaper stages 10 and 11 comprising a single or multiple buffers enhances the driving power of input multiphase clock CLK 101 and bCLK 102. The single-edge detection circuits I 20 and II 21 come after input clock reshaper circuits I 10 and II 11.

The present invention introduces four embodiments about single-edge detection circuit. It should be understood that these embodiments are only intended to describe technical approaches in the invention, but not to limit its claim. Any modification to or equivalent replacement of technical approaches in the invention with the same purpose and within the same scope of the present invention should be covered by claims of the invention.

Embodiment 1 of Single-Edge Detection Circuit

Figure 2:
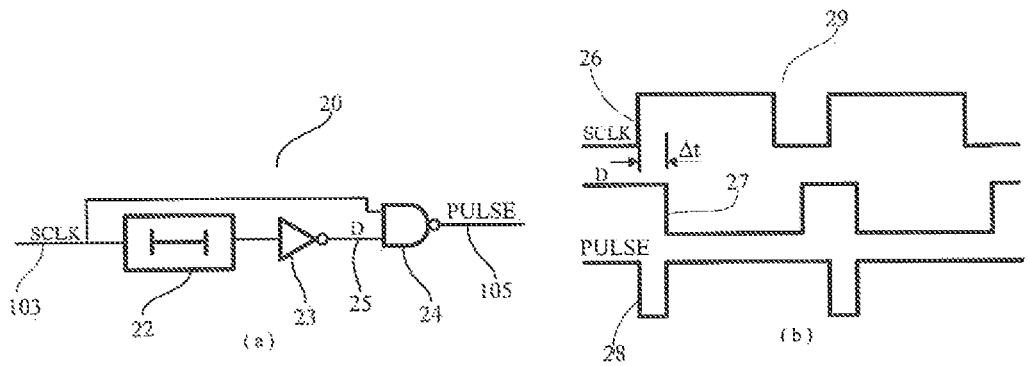
FIG. 2(a) is a circuit drawing showing Embodiment 1 of the single-edge detection circuit in FIG. 1.
FIG. 2(b) is a timing diagram of FIG. 2(a)

FIG. 2(a) shows a rising-edge detection circuit, which comprises an NAND gate 24, a delay unit 22 and an inverter 23. The delay unit 22 consists of a chain of buffers or an even number of inverters. The input clock signal SCLK 103 goes through delay unit 22 and inverter 23 to generate delayed inverted clock signal D 25. The other clock signal SCLK, along with delayed reversed clock signal D 25, is input into NAND gate 24 to generate pulse signal PULSE 105. FIG. 2(b) shows timing sequence of the rising-edge detection circuit in FIG. 2(a). As shown in FIG. 2(a), as soon as the rising-edge detection circuit detects rising-edge of input clock signal SCLK 26, it outputs a low pulse signal PULSE 28. Since time delay $\Delta t$ of signal D 27 relative to input signal SCLK 26 is equal to the sum of delay times of delay unit 22 and inverter 24, low level duration of PULSE 28 is proportional to delay times of delay unit 22 and inverter 24. As delay time of delay unit and inverter is small, the width of low pulse PULSE 28 from rising edge detecting circuit is small, and its duty cycle is far larger than 50%. PULSE 28 is sent to duty cycle restorer circuit 30.

Embodiment 2 of Single-Edge Detection Circuit

Figure 3:
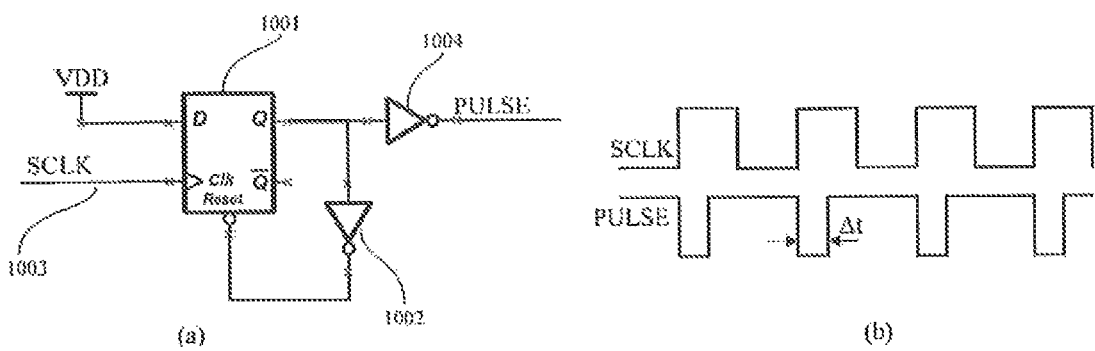
FIG. 3(a) is a circuit drawing showing Embodiment 2 of the single-edge detection circuit in FIG. 1.
FIG. 3(b) is a timing diagram of FIG. 3(a)

FIG. 3(a) shows a rising-edge detection circuit consisting of a rising-edge triggered D-type flip-flop 1001 with asynchronized reset function and inverters 1002 and 1004. The input clock signal SCLK 1003 is sent to clock input of D-type flip-flop 1001, whose digital input is connected to logic high level VDD, and positive phase output connected to input of Inverters 1002 and 1004. The input of Inverter 1002 is connected to asynchronized reset of D-type flip-flop 1001. Inverter 1004 outputs pulse signal PULSE.

FIG. 3(b) shows timing sequence of the rising-edge detection circuit in FIG. 3(a). The rising-edge detection circuit outputs a low pulse signal PULSE when rising-edge of input signal SCLK is detected. As shown in FIG. 3(b), pulse width $\Delta t$ equals to the sum of time delay of D-type flip-flop 1001 from asynchronized reset to positive output and time delay of inverter 1002. Therefore, the low level duration of PULSE is proportional to time delay of D-type flip-flop 1001 from asynchronized reset to positive output and the delay of inverter 1002. Since delays of D-type flip-flop 1001 and inverter are very small, width of the low PULSE from rising-edge detection circuit is small and its duty cycle is much greater than 50%. Output pulse of the rising edge detector is then fed into duty cycle restorer 30.

Embodiment 3 of Single-Edge Detection Circuit

Figure 4:
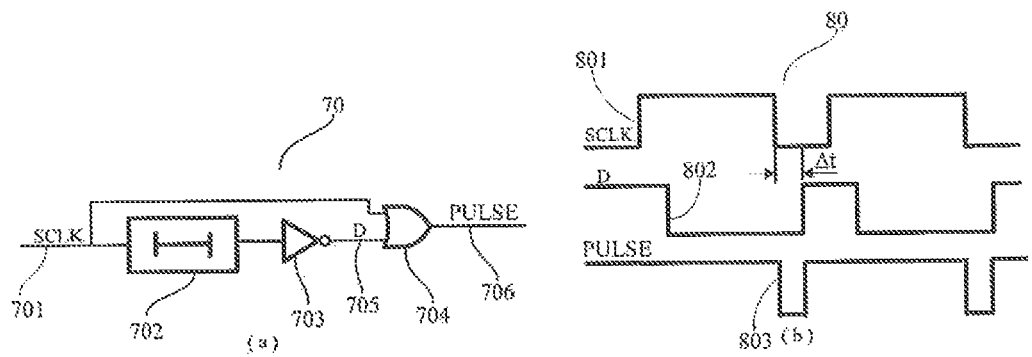
FIG. 4(a) is a circuit drawing showing Embodiment 3 of the single-edge detection circuit in FIG. 1.
FIG. 4(b) is a timing diagram of FIG. 4(a)

FIG. 4(a) shows a falling-edge detection circuit, which consists of an OR gate 704, a delay unit 702 and an inverter 703. The delay unit 702 consists of buffers and an even number of inverters. The input clock signal SCLK 701 goes through delay unit 702 and inverter 703 to generate delayed and reversed clock signal D 705. The other clock signal SCLK, together with the delayed reversed clock signal D 705, is input to NAND gate 704 to generate pulse signal PULSE 706. FIG. 4(b) shows a timing sequence of the falling-edge detection circuit in FIG. 3(a). As shown in FIG. 4(b), the falling-edge detection circuit outputs low pulse PULSE 803 when falling-edge of input clock signal SCLK 801 is detected. Since time delay Δt of signal D802 relative to input signal SCLK 801 is equal to the sum of delay times of delay unit 702 and inverter 703, low level duration of PULSE 803 is proportional to delay times of delay unit 702 and inverter 703. As delay time of delay unit and inverter is small, the width of low pulse PULSE 803 from rising edge detecting circuit is small, and its duty cycle is far larger than 50%. PULSE 803 is sent to duty cycle restorer circuit 30.

Embodiment 4 of Single-Edge Detection Circuit

FIG. 5(a) shows a falling-edge detection circuit, comprising a falling-edge triggered D-type flip-flop with asychronized reset function 2001 and inverter 2002 and 2004. Input clock signal SCLK 2003 is connected to clock input of D-type flip-flop 2001. The digital input of D-type flip-flop 2001 is connected to logic high level VDD. The positive phase output of D-type flip-flop 2001 is connected to input of inverter 2002 and 2004. The output of inverter 2002 is connected to asynchronized reset of D-type flip-flop 2001, and inverter 2004 outputs pulse signal PULSE.

Figure 5:
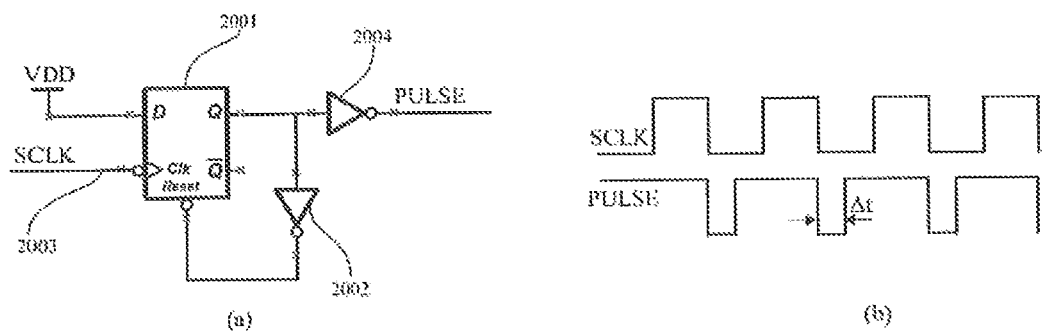
FIG. 5(a) is a circuit drawing showing Embodiment 4 of the single-edge detection circuit in FIG. 1.
FIG. 5(b) is a timing diagram of FIG. 5(a)

FIG. 5 (b) shows a timing sequence of the falling-edge detection circuit in FIG. 5(a). As shown in FIG. 5(b), the rising-edge detection circuit outputs low pulse signal PULSE when rising-edge of input clock signal SCLK is detected. From FIG. 5(b), it can be seen that pulse width Δt is equal to the sum of delay time of D-type flip-flop 2001 from asychronized reset to positive output and delay time of inverter 2002. Therefore, the low level duration of PULSE is proportional to delay time of D-type flip-flop 2001 from asychronized reset to positive output and delay time of inverter 2002. Since delay times of D-type flip-flop and inverter are small, the width of low pulse of the rising-edge detection circuit is small, and its duty cycle is much greater than 50%. PULSE is sent to duty cycle restorer 30.

The present invention introduces 2 embodiments of duty cycle restorer circuits. It should be understood that these embodiments are only intended to describe technical approaches in the invention, but not to limit its claim. Any modification to or equivalent replacement of technical approaches in the invention with the same purpose and within the same scope of the present invention should be covered by claims of the invention.

Embodiment 1 of Duty Cycle Restorer

Figure 6:
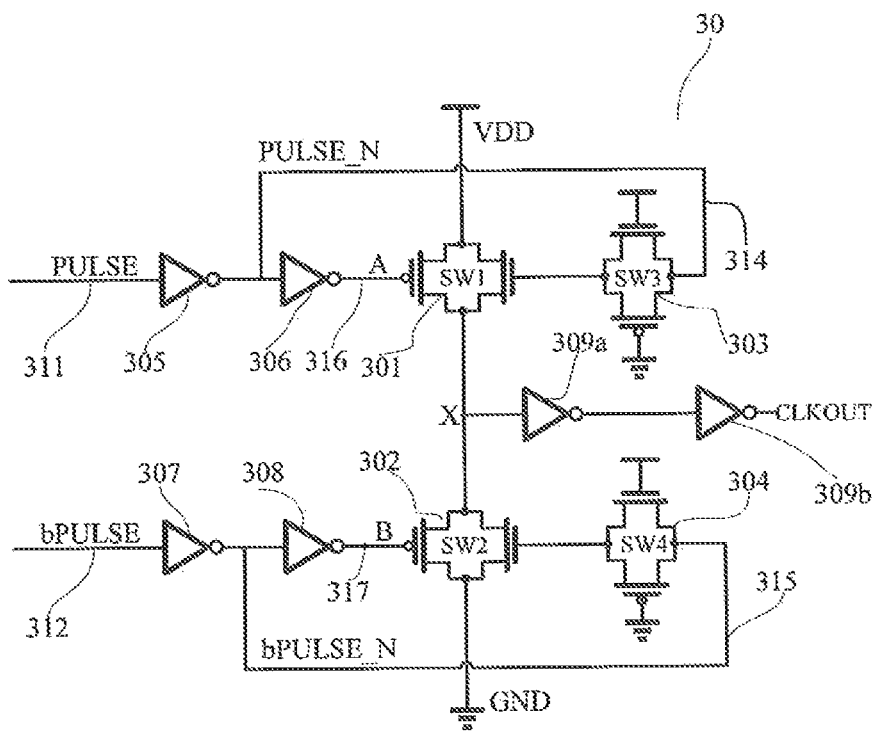
FIG. 6 is a circuit drawing showing Embodiment 1 of duty cycle restorer in FIG. 1.

FIG. 6 shows one of embodiments of duty cycle restorer 30. The duty cycle restorer consists of inverter I 305, inverter II 307, inverter III 306, inverter IV 308, inverter V 309a, inverter VI 309b, transmission gate I 301, transmission gate II 302, transmission gate III 303 and transmission gate IV 304. Input signal PULSE 311 goes through inverter I 305 to generate complementary control signal PULSE_N 314, and input signal bPULSE 312 goes through inverter II 307 to generate complementary control signal bPULSE_N 315. Complementary control signal PULSE_N 314 goes through converter III 306 to generate control signal A 316, and complementary control signal bPULSE N 315 goes through converter IV 308 to generate control signal B 317. Signal PULSE_N 314 and bPULSE_N 315 are delayed by transmission gates III 303 and IV 304 to generate control signal, which, together with signal A 316 and B 317, controls transmission gates 301 and 302. Inverters V and VI connected in series, wherein the input end of inverter V is connected to output of transmission gates III and IV, outputs clock signal through inverter VI.

Figure 7:
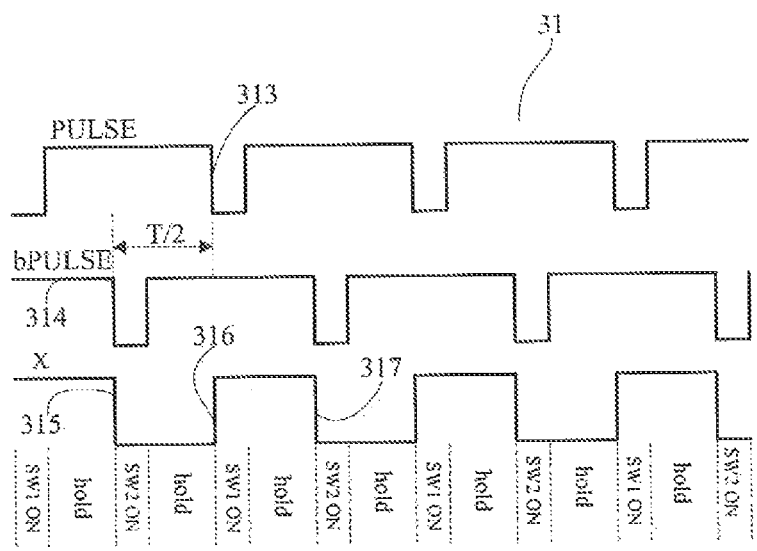
FIG. 7 is a timing diagram of FIG. 6.

FIG. 7 shows a timing sequence of duty cycle restorer circuit in FIG. 6. As shown in FIG. 7, when pulse signal PULSE 311 is low and bPLUSE 312 is high, transmission gate III 301 turns on. Voltage value at X node equals to power supply VDD. When pulse signal PULSE 311 and bPULSE 312 are high, voltage at X node keeps the last value and remains unchanged, for parasitic capacitance at X-node can store charges temporarily. When pulse signal PULSE 311 is high and bPLUSE 312 is low, transmission gate IV 302 turns on and voltage value at X node is low level. Since the phase of bPULSE 314 is 180° lag behind phase of PULSE 313, duty cycle of voltage at X node is 50%. Inverter V 309a comes after X node. The input of inverter VI 309b is connected to output of inverter V 309a. Inverters V309a and VI 309b enhances signal driving power at X node while screening the external load.

Embodiment 2 of Duty Cycle Restorer

Figure 8:
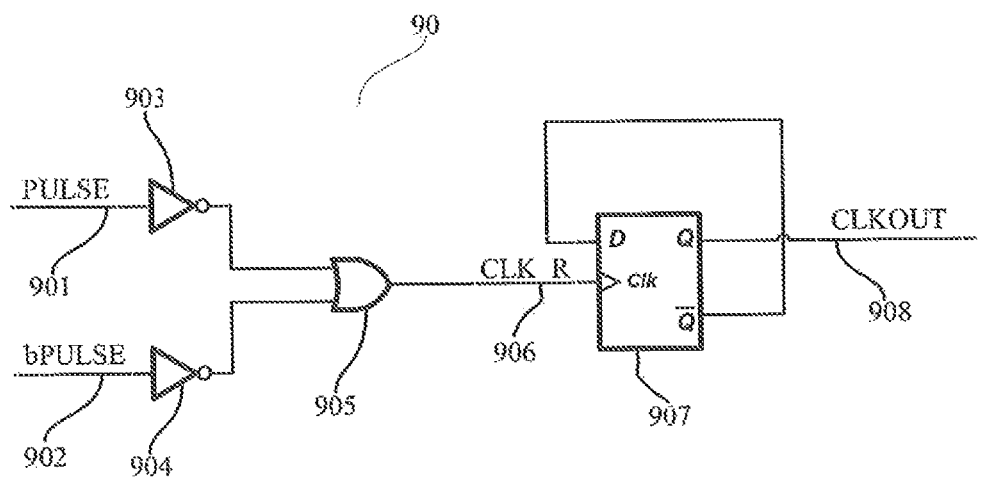
FIG. 8 is a circuit drawing showing Embodiment 2 of duty cycle restorer in FIG. 1.

FIG. 8 shows another embodiment of duty cycle restorer 30 in FIG. 1. This embodiment has pulse signals PULSE 901 and bPULSE 902 as input and outputs clock signal CLKOUT 908, which has 50% duty cycle. The duty cycle restorer consists of two inverters 903 and 904, an OR gate 905 and rising-edge triggered edge-trigger 907. Input pulse signal PULSE 901 is connected to input of inverter 903, and input pulse signal bPULSE 902 is connected to input of inverter 904. Outputs of inverters 903 and 904 are connected to two inputs of OR gate 905. The output signal CLK_R 906 from OR gate 905 is connected to clock input of rising-edge triggered edge-trigger 907, whose digital input is connected to reversed output of edge-trigger 907.

Figure 9:
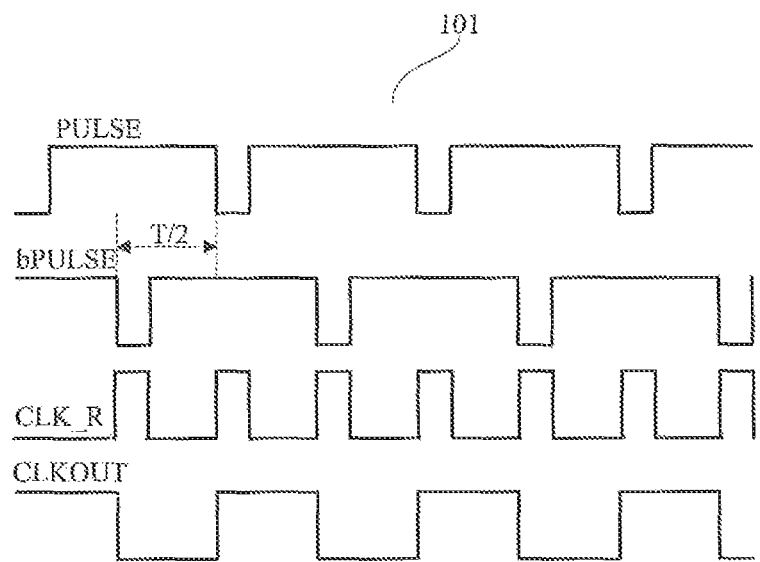
FIG. 9 is a timing diagram of FIG. 8.

FIG. 9 shows a timing sequence of duty cycle restorer in FIG. 6. Input pulse signals PULSE and bPULSE goes through inverters and OR gate to generate a pulse sequence CLK_R. The period of pulse sequence CLK_R is one half of input clock signal period. So, rising edge triggered edge-trigger 907 performs a mode-switch every half input clock period. Both low and high level durations of output clock signal CLKOUT are a half of input signal period. The output clock signal CLKOUT features a 50% duty cycle.

Figure 10:
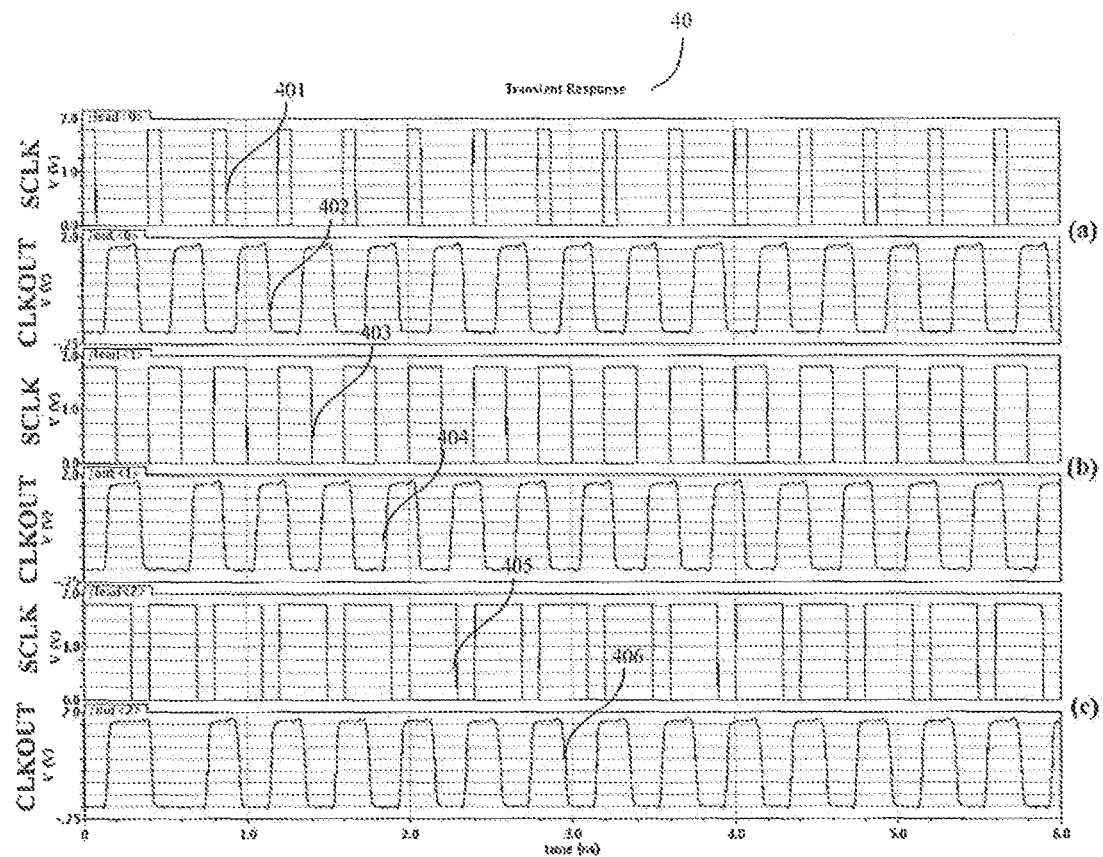
FIG. 10 shows simulated timing sequence of the present invention.

FIG. 10 shows a complete timing sequence of the invention. FIG. 10(a) shows an input duty cycle of 20%. FIG. 10(b) shows an input duty cycle of 50%. FIG. 10(c) shows an input duty cycle of 80%. As shown in FIG. 10(a), input signal SCLK 401 is a clock signal output from PLL VCO, which has a duty cycle of 20%, and output signal CLKOUT 402 is an output clock waveform processed by the invention.

It can be seen from FIG. 10(*a*) that the duty cycle of output waveform is 50%, even if duty cycle of input waveform is much smaller than 50%. As shown in FIG. 8(*b*), input signal SCLK 403 is an output clock signal from PLL VCO, which has 50% duty cycle, and output signal CLKOUT 404 is output clock waveform processed by the invention. In FIG. 8(*c*), input signal SCLK 405 is an output clock signal from PLL VCO, which has 80% duty cycle, and output signal CLKOUT 406 is output clock waveform processed by the invention. As shown in FIG. 10(*c*), the output waveform has a duty cycle of 50%, even if the duty cycle of input waveform is much greater than 50%.

The foregoing preferred embodiments are provided to describe, not to limit, technical approaches in the present invention. Obviously, bearing the essence and concept of the present invention, technologists in this field can make various changes and redesigns to the present invention. It should be understood that those changes and redesigns are also covered by claims of the present invention, if they are with the same purpose and within the same scope of the present invention.

What is claimed is:

1. A high speed duty cycle correction and a double to single ended conversion circuit for PLL, comprising:
    A clock input reshaper stage, comprising two clock inputs, reshaping circuits I and II receiving signals 180° out of phase from the clock inputs, respectively, an outputting a driving clock signal;
    A single-edge detection circuit, comprising two single-edge detection circuits I and II, respectively, receiving signals from clock input reshaping circuits I and II, each of the single-edge detection circuit detects rising or falling edge of the clock signal and then outputs pulse signals; and
    A duty cycle restorer receiving pulse signals 180° out of phase from the two single-edge detection circuits I and II, and then outputs 50% duty cycle clock signals with the same frequency as pulse signals, the duty cycle restorer comprising:
    Inverters I and II, which receive large duty cycle pulse signals from single-edge detection circuits I and IL respectively;
    Inverters III and IV, which receive reversed pulse signals with large duty cycle from Inverters I and IL respectively;
    Transmission gates I and II, receive reversed pulse signals from Inverters I and II, respectively, and generate delayed pulse signals;
    Transmission gates III and IV, one of which is controlled by pulse signals from Transmission gate I and reversed pulse signals from Inverter III, and the other is controlled by pulse signals from Transmission gate II and reversed pulse signals from Inverter IV, respectively, to generate high/low levels; and
    Inverters V and VI in series, wherein input of Inverter V is connected to output of Transmission gated III and IV, and output clock signal through Inverter VI.

2. The high speed duty cycle correction and double to single ended conversion circuit for PLL according to claim 1, wherein the single-edge detection circuits I and II are each configured to detect rising-edges of the signals form the respective clock input reshaping circuits, and, when detecting a rising-edge of input clock signal, outputs a low pulse signal.

3. The high speed duty cycle correction and double to single ended conversion circuit for PLL according to claim 2, wherein the single-edge detection circuits I and/or II each comprise a rising-edge detector which comprises
    A delay unit to receive clock signal and generate its delay signal;
    An inverter to receive delayed clock signal and generate a clock signal in reverse phase, and
    An NAND gate to receive clock signal and the delayed signal in reverse phase, and to generate pulse signal.

4. The high speed duty cycle correction and double to single ended conversion circuit for PLL according to claim 2, wherein the single-edge detection circuits I and/or II each comprise a rising-edge detector which comprises
    A D-type trigger by rising-edge, which receives clock signal at its clock input and connects its digital input to logic high level VDD
    Inverter I, whose input is connected to positive phase output of D-type trigger, and output connected to asynchronized reset of D-type trigger
    Inverter II, which connects to positive phase output of D-type trigger at its input, and outputs pulse signal.

5. The high speed duty cycle correction and double to single ended conversion circuit for PLL according to claim 1, wherein the single-edge detection circuit I and each comprise a falling-edge detector, which outputs a low pulse signal when detecting a falling-edge signal.

6. The high speed duty cycle correction and double to single ended conversion circuit for PLL according to claim 5, wherein the single-edge detection circuits I and/or II each comprise a falling-edge detector, which comprises
    A delay unit to receive clock signal and generate its delay signal
    An inverter to receive delay signal and generate signal in reverse phase, and
    An OR gate to receive clock signal and delayed signal in reverse phase, and generate pulse signal.

7. The high speed duty cycle correction and double to single ended conversion circuit for PLL according to claim 5, wherein the single-edge detection circuits I and/or II each comprise a falling-edge detector, which comprises
    A D-type trigger by falling-edge, which receives clock signal at its clock input, and connects its digital input to logic high level VDD;
    Inverter I, whose input is connected to positive phase output of D-type trigger and output connected to asynchronized reset of D-type trigger;
    Inverter II, which connects to positive phase output and outputs pulse signal.

* * * * *